United States Patent
Stewart

(10) Patent No.: US 11,945,030 B2
(45) Date of Patent: Apr. 2, 2024

(54) METHOD OF FORMING ARTICLE, COATED POWDER AND ARTICLE

(71) Applicant: ROLLS-ROYCE PLC, London (GB)

(72) Inventor: David A. Stewart, Derby (GB)

(73) Assignee: ROLLS-ROYCE PLC, London (GB)

( * ) Notice: Subject to any disclaimer, the term of this patent is extended or adjusted under 35 U.S.C. 154(b) by 4 days.

(21) Appl. No.: 17/957,713

(22) Filed: Sep. 30, 2022

(65) Prior Publication Data
US 2023/0131097 A1 Apr. 27, 2023

(30) Foreign Application Priority Data
Oct. 21, 2021 (GB) .................................. 2115066

(51) Int. Cl.
B22F 1/14 (2022.01)
B22F 1/16 (2022.01)
B22F 3/15 (2006.01)

(52) U.S. Cl.
CPC .................. *B22F 1/14* (2022.01); *B22F 1/16* (2022.01); *B22F 3/15* (2013.01); *B22F 2301/15* (2013.01);
(Continued)

(58) Field of Classification Search
CPC ...... B22F 1/14; B22F 1/16; B22F 3/15; B22F 2301/15; B22F 2301/20; B22F 2301/35;
(Continued)

(56) References Cited

U.S. PATENT DOCUMENTS 4,985,309 A * 1/1991 Ogura ................. C22C 33/0207
428/570
5,603,815 A 2/1997 Lashmore et al.
(Continued)

FOREIGN PATENT DOCUMENTS

| CN | 108746602 A | 11/2018 |
|----|----|----|
| JP | S63-096227 A | 4/1988 |
| WO | 98/42466 A1 | 10/1998 |

OTHER PUBLICATIONS

Jan. 11, 2023 Extended European Search Report Issued in European Patent Application No. 22198933.8.
(Continued)

*Primary Examiner* — Rebecca Janssen
(74) *Attorney, Agent, or Firm* — Oliff PLC

(57) ABSTRACT

A method of forming an article includes producing a base powder including a plurality of base particles. Each base particle includes an external surface and a first material. The method further includes removing one or more oxides from the external surface of each base particle to form a cleaned powder including a plurality of cleaned particles. Each cleaned particle includes a cleaned external surface made of the first material. The method further includes coating the cleaned external surface of each cleaned particle with a second material having a greater oxidation resistance than the first material to form a coated powder including a plurality of coated particles. Each coated particle includes an external layer including the second material that fully covers the cleaned external surface made of the first material. The method further includes forming the article using the coated powder.

20 Claims, 8 Drawing Sheets

(52) U.S. Cl.
CPC ....... *B22F 2301/20* (2013.01); *B22F 2301/35* (2013.01)

(58) Field of Classification Search
CPC .............. B22F 2998/00; B22F 2998/10; B22F 2999/00; B22F 1/17; B22F 9/04; B22F 1/142; B22F 1/145; B22F 9/14; B22F 2202/11; B22F 3/02; B22F 3/04; B22F 10/00; B22F 3/225; B33Y 70/00; C23C 14/022; C23C 14/16; C23C 14/223; C23C 16/0245; C23C 16/4417; C23C 18/1241; C23C 16/06; C22C 33/0264; C22C 33/0285; C22C 33/0257; C22C 38/18; Y02P 10/25
See application file for complete search history.

(56) References Cited

U.S. PATENT DOCUMENTS

| | | | |
|---|---|---|---|
| 5,711,866 A | | 1/1998 | Lashmore et al. |
| 6,251,339 B1* | | 6/2001 | Beane ...................... C25D 7/00 419/46 |
| 2018/0318922 A1* | | 11/2018 | Vallsˊ Anglés ........... C22C 19/03 |
| 2021/0002772 A1* | | 1/2021 | Kwak ..................... C22C 18/00 |

OTHER PUBLICATIONS

Apr. 13, 2022 Search Report issued in British Patent Application No. 2115066.9.

* cited by examiner

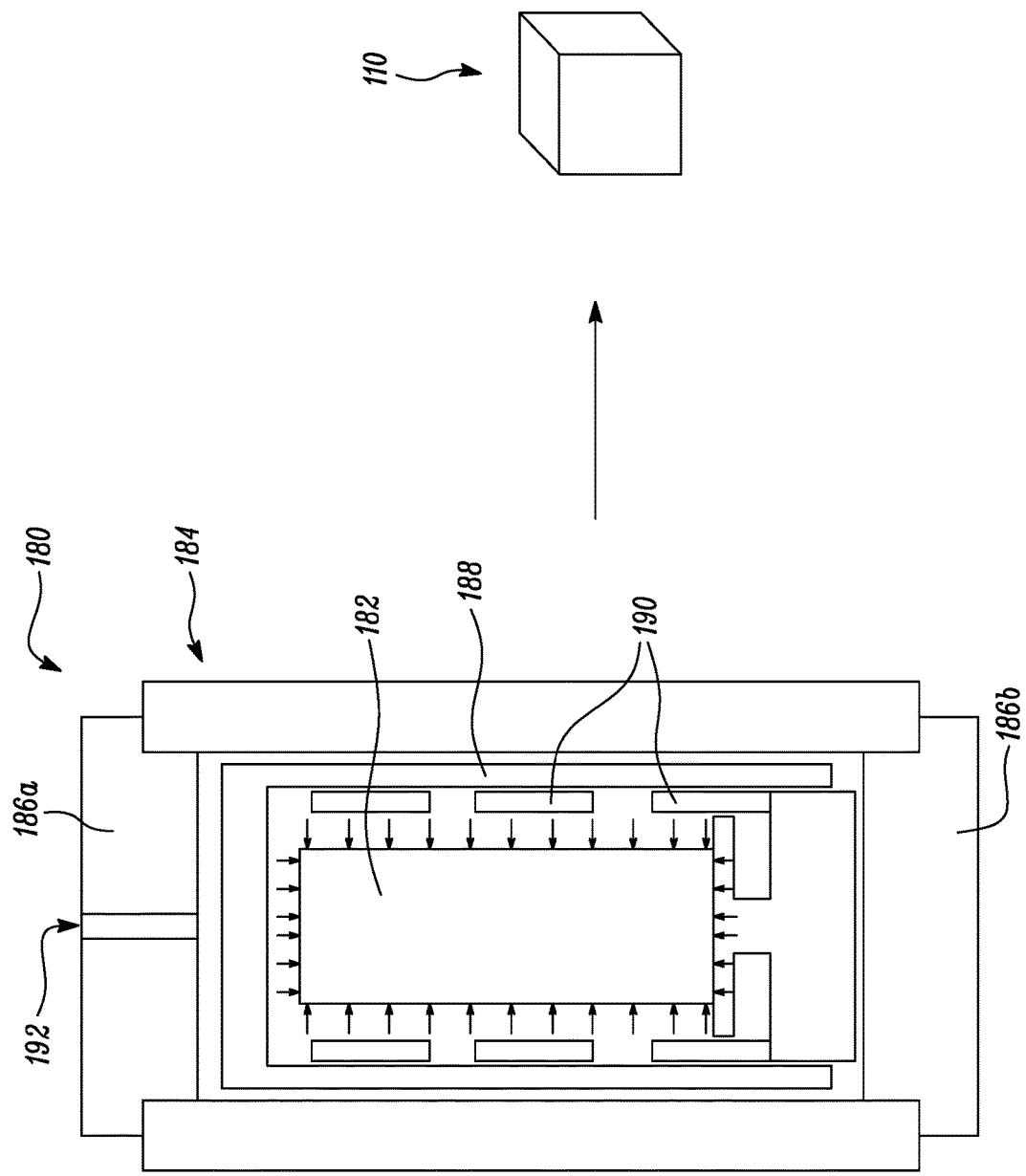

METHOD OF FORMING ARTICLE, COATED POWDER AND ARTICLE

FIELD OF THE DISCLOSURE

The present disclosure relates to a method of forming an article, a coated powder for forming the article, and the article formed from the coated powder.

BACKGROUND

Raw material for manufacturing processes, such as hot isostatic pressing (HIP), additive manufacturing, etc., involve use of powders, e.g., metallic powders. Such powders may typically be manufactured as gas atomised powders which are then used for further processing. These powders generally undergo intermediate powder handling processes, such as screening to ensure the correct powder size distribution, testing of the powder for determining chemical and physical characteristics, etc.

Powder, especially metallic powder, typically gets oxidised during handling between the processes. Oxygen pickup on the powder is almost impossible to avoid, and the presence of oxides on the powder may negatively impact material properties (e.g., toughness and ductility) of an end product. Some powder compositions are more tolerant to oxidation (e.g., 300 series stainless steel, etc.) while other powder compositions are less tolerant (e.g., low alloy steels, etc.).

Oxidation resistance of stainless steels is provided primarily by alloyed chromium and/or nickel. The chromium is typically present in quantities between 10-20% w/w of the alloy and the nickel between 7-9% w/w. Whilst these may have a powder form and are inherently corrosion resistant the steels may have properties that are undesirable in a finished article e.g. pressure vessel.

Low alloy steels have 8% or lower amounts of chromium w/w and optional amounts of nickel. The low levels of alloying material mean that the steel is not resistant to corrosion.

Current practice is to minimise or exclude oxygen at all times during manufacturing of the powder and all subsequent powder handling operations. This is achieved through various methods, such as use of air and moisture evacuation procedures, inert atmosphere gas purges, controlled atmosphere glove boxes incorporating airlocks, isolation valves, etc. Such preventative measures may introduce risk as any one failure may cause an entire batch of the powder to be contaminated, and hence, ultimately scrapped. Use of such measures also impacts the processing time of the powder and adds complexity and cost to the overall manufacturing process.

SUMMARY

According to a first aspect there is provided a method of forming an article. The method includes producing a base powder including a plurality of base particles. Each base particle includes an external surface and a first material consisting of a low alloy steel. The method further includes removing one or more oxides from the external surface of each base particle of the base powder to form a cleaned powder including a plurality of cleaned particles. Each cleaned particle includes a cleaned external surface made of the low alloy steel. The method further includes coating the cleaned external surface of each cleaned particle of the cleaned powder with a nickel and/or chromium second material having a greater oxidation resistance than the first material to form a coated powder including a plurality of coated particles. Each coated particle includes an external layer including the second material that fully covers the cleaned external surface made of the first material. The method further includes forming an article using the coated powder.

Use of the coated powder including the plurality of coated particles for forming the article may eliminate the need for any preventative measures to minimise or exclude oxygen during a process of forming the article. This may reduce a cost of forming the article as well as the complexity of the overall process. The one or more oxides that may be present on the external surface of the base particles may first be removed to form the cleaned powder including the cleaned particles. Each cleaned particle may then be coated with the second material such that the second material fully covers the cleaned external surface of each cleaned particle. The second material may offer greater oxidation resistance and prevent formation of the one or more oxides on the plurality of coated particles.

In some embodiments, the base powder is produced by one of an atomisation process, a plasma-rotating electrode process, a sol-gel process, and mechanical milling.

In some embodiments, the one or more oxides from the external surface of each base particle is removed by ion beam sputtering.

In some embodiments, the cleaned external surface of each cleaned particle is coated with the second material by one of physical vapour deposition, chemical vapour deposition, and electroless plating.

In some embodiments, each coated particle includes at least 90%, or at least 91%, or at least 92%, or at least 93%, or at least 94%, or at least 95%, or at least 96%, or a least 97% by weight of the first material.

In some embodiments, each coated particle includes at most 3%, or at most 4%, or at most 5%, or at most 6%, or at most 7%, or at most 8%, or at most 9%, or at most 10% by weight of the second material.

In some embodiments, the coated powder is formed into the article by a hot isostatic pressing process, such that the second material is uniformly distributed throughout a volume of the article by diffusion. The amount of second material used for coating the cleaned particles may be chosen based on a desired amount of the second material in an end composition of the article formed after the hot isostatic pressing process. The second material may then be uniformly distributed throughout the volume of the article.

In some embodiments, the hot isostatic pressing process is carried out in a non-inert and non-vacuum environment. Use of the coated powder for forming the article may eliminate the need for any preventative measures to minimise or exclude oxygen during the hot isostatic pressing process. This may reduce a cost of forming the article as well as the complexity of the hot isostatic pressing process.

According to a second aspect, there is provided a coated powder for forming an article. The coated powder includes a plurality of coated particles. Each coated particle includes a base body made of a first material and an external layer fully covering the base body. The external layer is made of a second material having a greater oxidation resistance than the first material.

In some embodiments, each coated particle includes at most 3%, or at most 4%, or at most 5%, or at most 6%, or at most 7%, or at most 8%, or at most 9%, or at most 10% by weight of the second material.

According to a third aspect, there is provided an article formed from the coated powder. The article includes each of the first material and the second material uniformly distributed throughout a volume of the article. In some embodiments the article includes at most 3%, or at most 4%, or at most 5%, or at most 6%, or at most 7%, or at most 8%, or at most 9%, or at most 10% by weight of the second material. In some embodiments the article includes at least 90%, or at least 91%, or at least 92%, or at least 93%, or at least 94%, or at least 95%, or at least 96%, or a least 97% by weight of the first material.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which:

FIG. 8 is a schematic view of an apparatus for forming the article, according to an embodiment of the present disclosure.

DETAILED DESCRIPTION

Aspects and embodiments of the present disclosure will now be discussed with reference to the accompanying figures. Further aspects and embodiments will be apparent to those skilled in the art.

Figure 1:
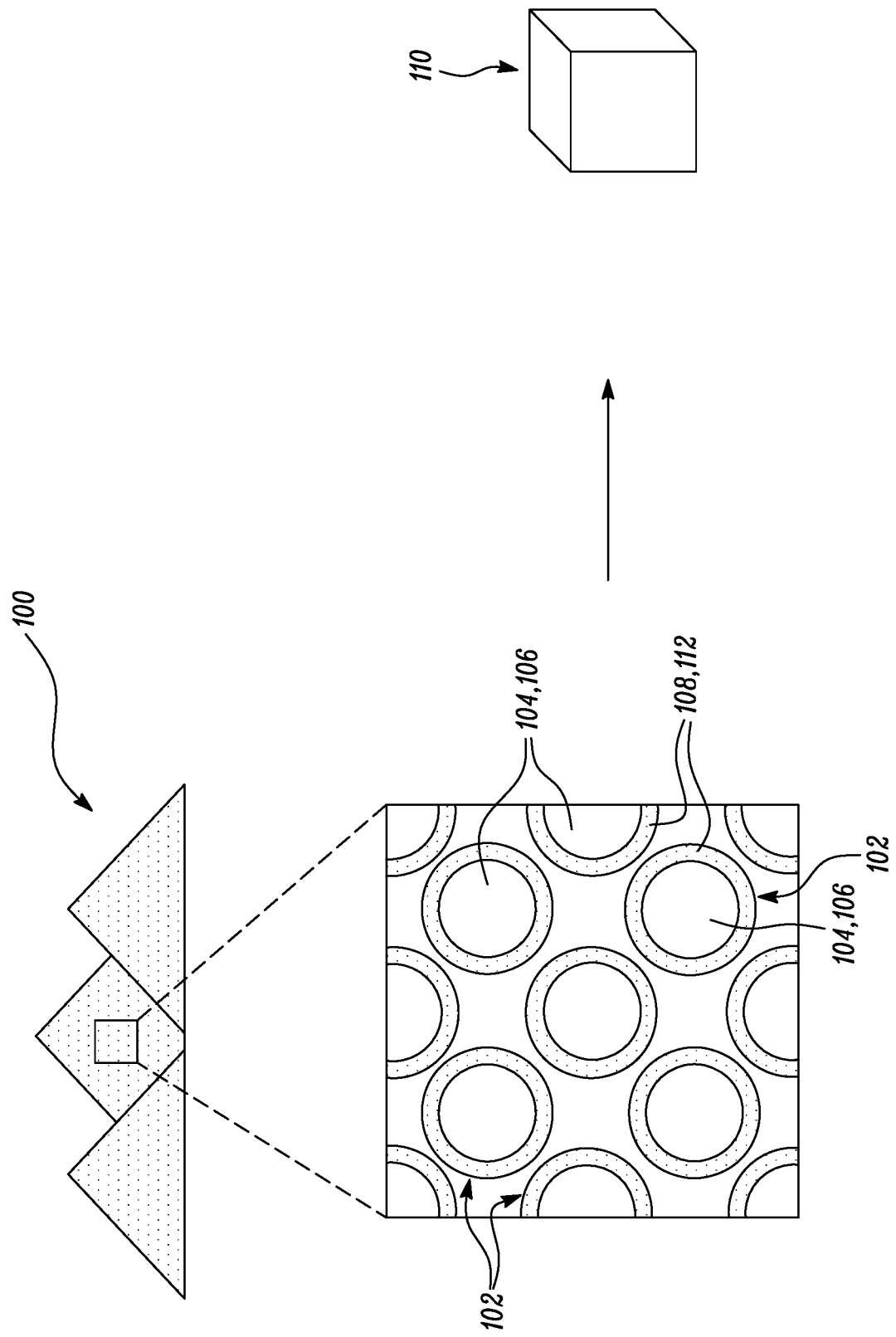
FIG. 1 is a schematic view of a coated powder for forming an article, according to an embodiment of the present disclosure.

FIG. 1 illustrates a schematic view of a coated powder 100 for forming an article 110. In some embodiments, the article 110 is formed from the coated powder 100 as a main raw material. In some embodiments, the article 110 may be produced by fusion or solidification of the coated powder 100 using, for example, sintering, die pressing, additive manufacturing techniques, hot isostatic pressing (HIP), cold isostatic pressing (CIP), injection moulding, etc., or by application of heat and/or pressure.

In the illustrated embodiment of FIG. 1, the article 110 is shown as a standard shape for illustrative purposes, however, the article 110 may assume any desired shape (regular or irregular) and size based on application requirements.

In some embodiments, the coated powder 100 includes a plurality of coated particles 102. A schematic sectional view of each coated particle 102 is shown in FIG. 1. Each coated particle 102 incudes a base body 104 made of a first material 106 and an external layer 108 fully covering the base body 104. The first material 106 may be a low alloy steel.

In some embodiments, the external layer 108 is made of a second material 112 having a greater oxidation resistance than the first material 106. Thus, the second material 112 may protect the first material 106 from oxidation. In the present disclosure and the like, the "second material 112" having a greater oxidation resistance than the first material 106 is a metal having a greater oxidation resistance than materials used for first material 106, e.g., low alloy steel. In other words, the second material 112 is a metal having higher Gibbs free energy of oxidation reaction than the first material 106. In some circumstances the greater oxidation resistance is provided by a second material that provides a more stable oxide. In other words an oxide of the second material is less likely to shed and present virgin unoxodised material to an oxygen containing atmosphere. In some embodiments, the second material 112 is chromium and/or nickel.

In some embodiments, each coated particle 102 includes at most 10% by weight of the second material 112. It should be understood that the wt. percentage of each of the first material 106 and the second material 112 in the coated particles 102 is exemplary in nature and may vary based on application requirements. In some embodiments, the wt. percentage of the first material 106 and the second material 112 may be chosen based on a desired end composition of the material of the article 110 to be produced. In some embodiments, the article 110 includes each of the first material 106 and the second material 112 uniformly distributed throughout a volume of the article 110. In some embodiments the thickness of the coating is determined by the average size of the cleaned particles.

Figure 2:
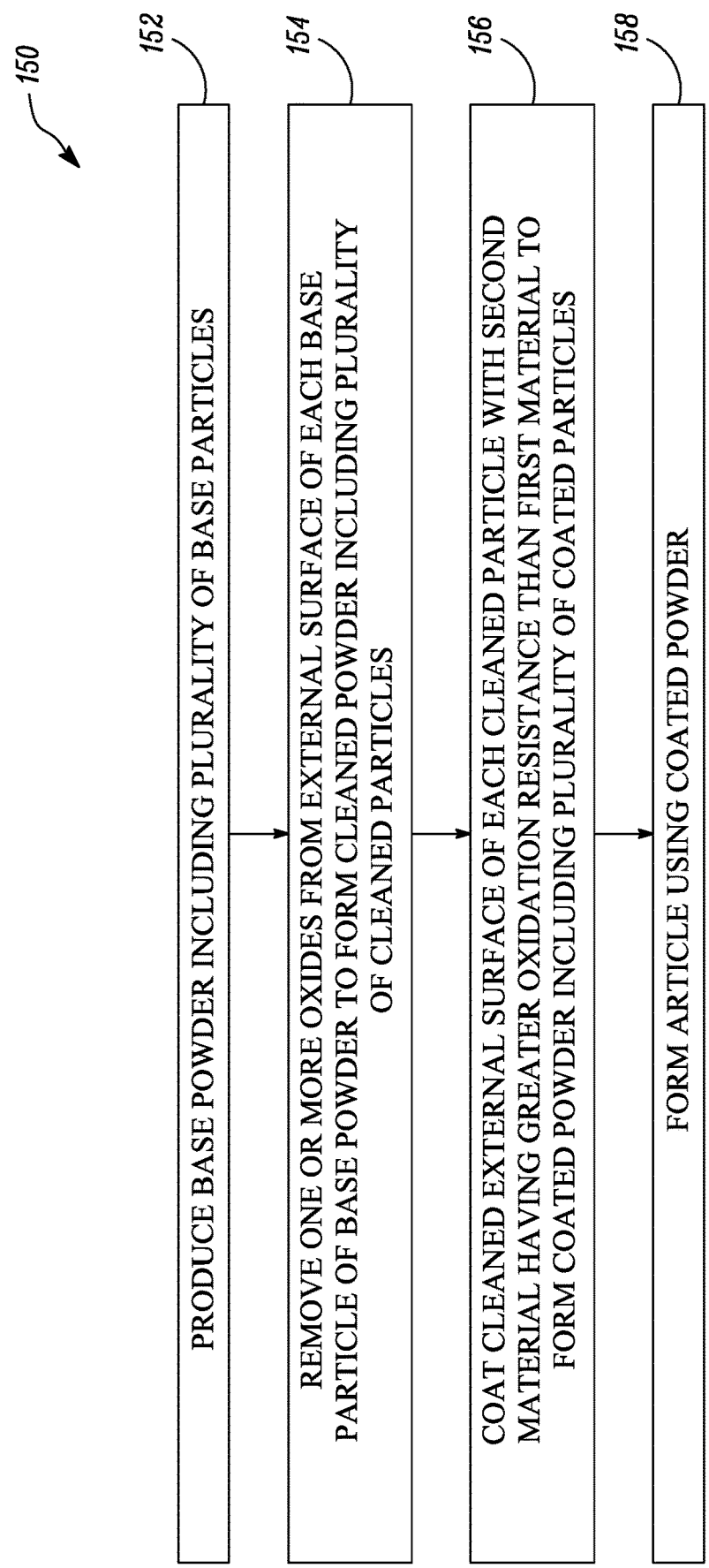
FIG. 2 is flow chart illustrating a method of forming the article of FIG. 1, according to an embodiment of the present disclosure.

FIG. 2 is a flow chart illustrating an exemplary method 150 of forming an article. In some embodiments, the article may be similar to the article 110 shown in FIG. 1. The method 150 will be described with reference to the coated powder 100 and article 110 of FIG. 1 and FIGS. 3-8.

Figure 3:
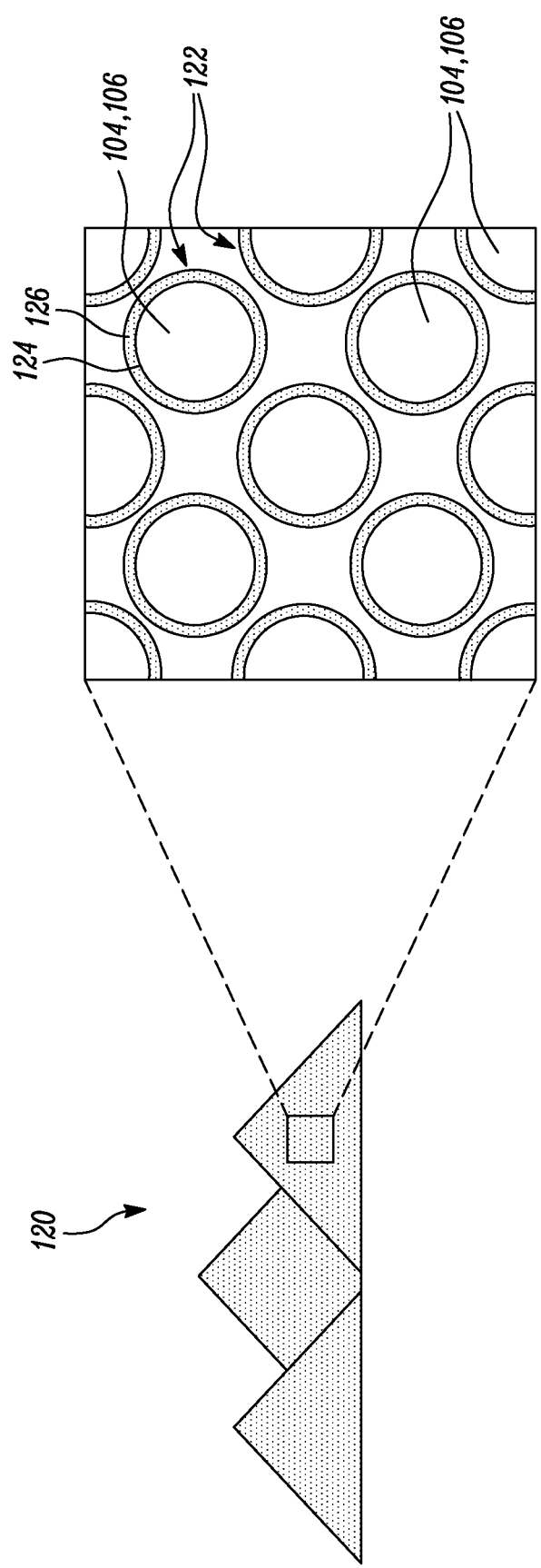
FIG. 3 is a schematic view of a base powder, according to an embodiment of the present disclosure.

FIG. 3 illustrates a schematic view of a base powder 120, according to an embodiment of the present disclosure. Referring now to FIGS. 2 and 3, at step 152, the method 150 includes producing the base powder 120 including a plurality of base particles 122. A schematic sectional view of each base particle 122 is shown in FIG. 3. In some embodiments, the base powder 120 may be produced by one of an atomisation process, a plasma-rotating electrode process, a sol-gel process, and mechanical milling.

Generally, the atomisation process involves forcing a liquid metal placed in a distributor through a nozzle to obtain a thin jet which is dispersed in the form of particles by rapid motion of a gas or of a stream of liquid.

Plasma rotating electrode process is a liquid metal-fed physical method to produce powders in which a liquid stream of molten metal is poured onto a rotating disk or similar shape and is broken and dispersed, under the action of centrifugal forces, into a fine powder particulate matter that subsequently solidifies in contact with a controlled atmosphere (e.g., an inert atmosphere). The metal may be melted by various energy sources, such as helium plasma.

Mechanical milling is used to change properties of powders, including disintegration of particle aggregates, particle shape, and particle surface characteristics. Mechanical milling may include a variety of techniques, such as, for example, ball milling, vibratory milling, and attrition milling.

Each base particle 122 includes an external surface 124 and the first material 106. When producing the base powder 120 or the base particles 122, especially, metallic powders, using the above-mentioned techniques, there is often an unintentional oxidation of the external surface 124 of the base particles 122 due to contact with oxygen in the atmosphere. Formation of one or more oxides on the external surface 124 during handling of the base powder 120 may be considered an undesirable effect which opposes the formation of metallic bonds during formation of the article 110 (shown in FIG. 1). Therefore, it may be desirable to remove the one or more oxides from the external surface 124 before the base powder 120 is used for forming of the article 110 (shown in FIG. 1).

In the illustrated embodiment of FIG. 3, a layer 126 is schematically shown representing the one or more oxides on the external surface 124 of the base particles 122. In some embodiments, the one or more oxides may fully cover the external surface 124 of the base particles 122.

Figure 4:
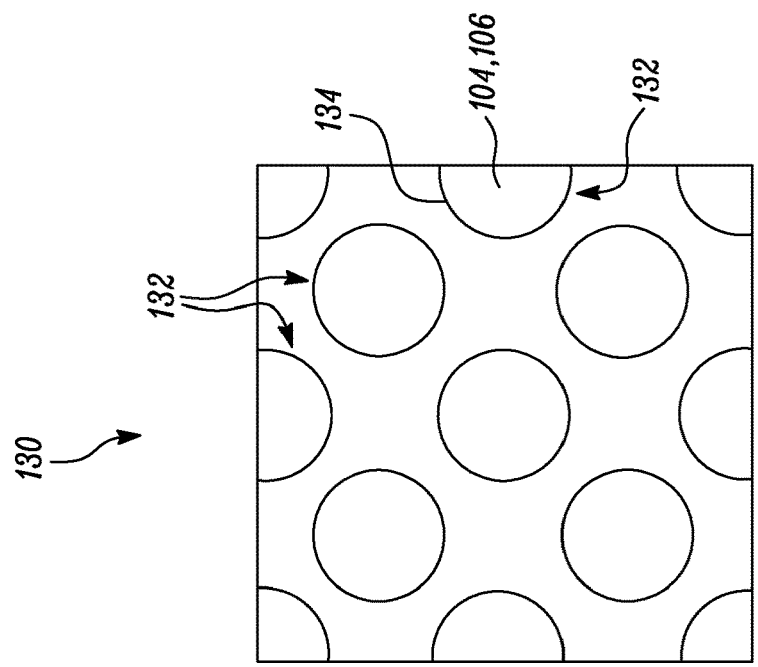
FIG. 4 is a schematic view of the base powder and a cleaned powder, according to an embodiment of the present disclosure.
Figure 4:
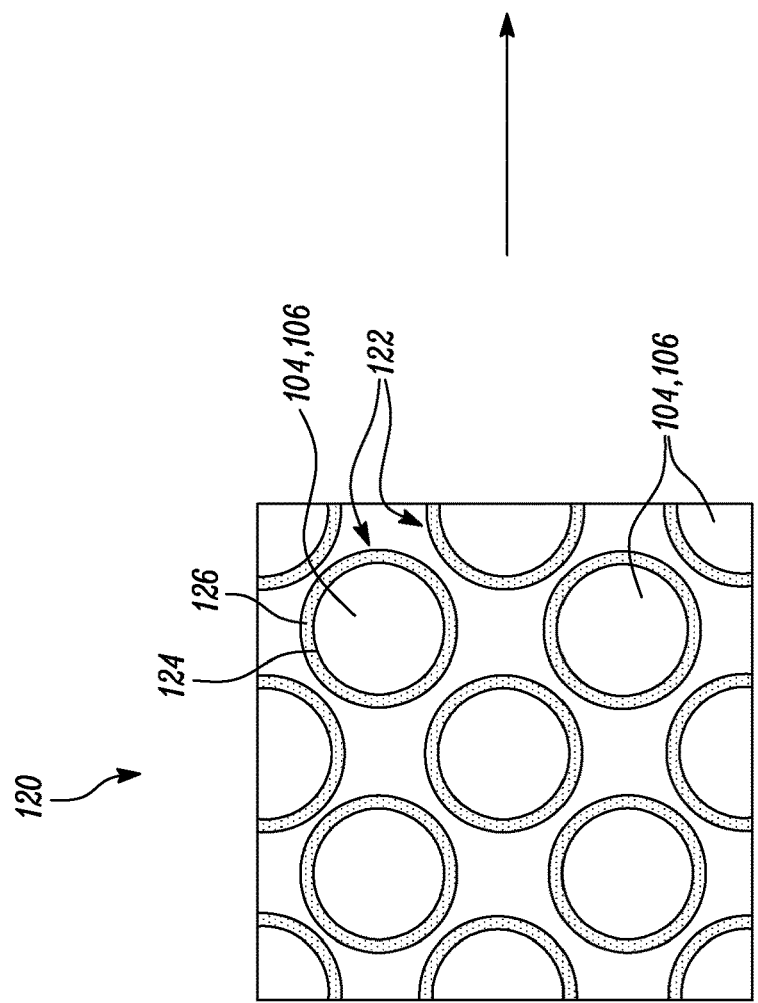

FIG. 4 illustrates a schematic view of the base powder 120 and a cleaned powder 130, according to an embodiment of the present disclosure. Referring now to FIGS. 2 and 4, at step 154, the method 150 further includes removing the one or more oxides (e.g., the layer 126) from the external surface 124 of each base particle 122 of the base powder 120 to form the cleaned powder 130 including a plurality of cleaned particles 132. A schematic sectional view of each base particle 122 and each cleaned particle 132 is shown in FIG. 4. Each cleaned particle 132 includes a cleaned external surface 134 made of the first material 106. In other words, each cleaned particle 132 includes the base body 104 and the cleaned external surface 134 made entirely of the first material 106. The cleaned external surfaces 134 of the cleaned particles 132 may be free from the one or more oxides (e.g., the layer 126) present on the external surface 124 of each base particle 122.

Figure 5:
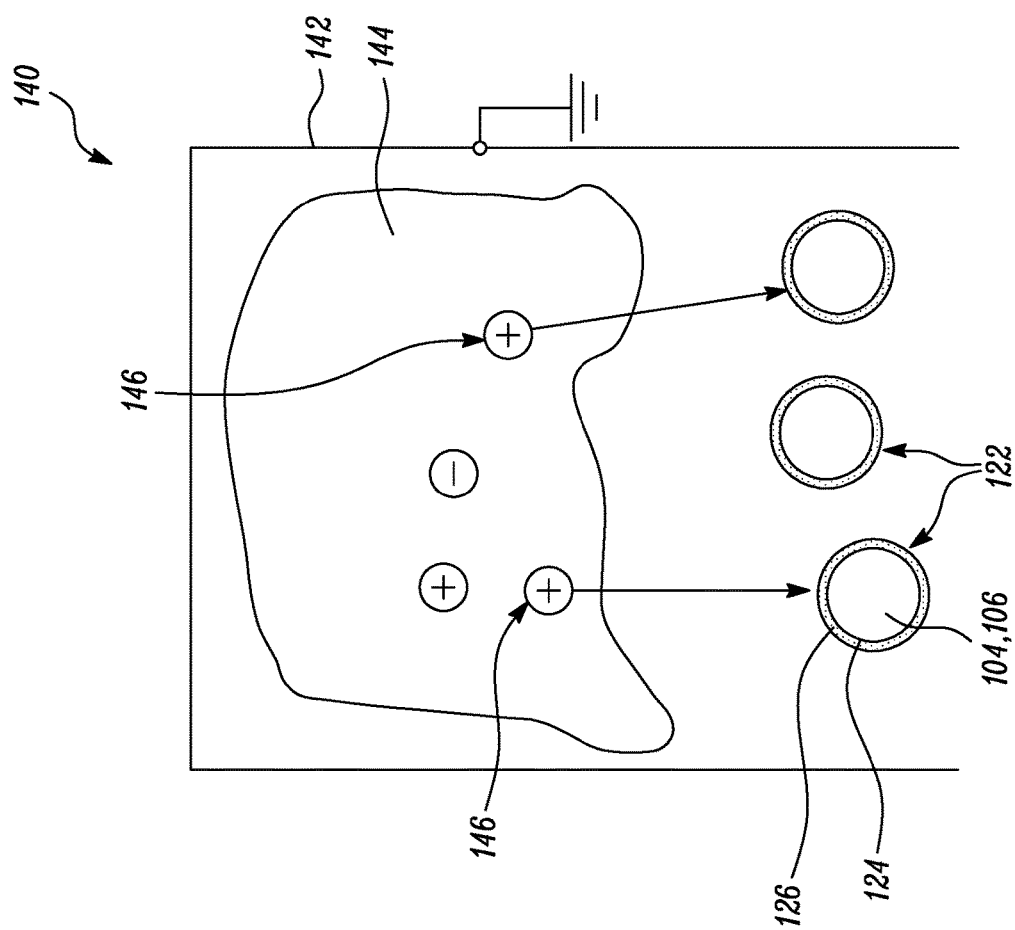
FIG. 5 is a schematic view of an apparatus for sputter-cleaning an external surface of base particles, according to an embodiment of the present disclosure.

In some embodiments, the one or more oxides (e.g., the layer 126) from the external surface 124 of each base particle 122 is removed by ion beam sputtering. FIG. 5 illustrates a schematic view of an exemplary apparatus 140 for sputter-cleaning the external surface 124 of the base particles 122 using ion beam sputtering. Generally, the term ion beam sputtering refers to an "atomistic" process in which neutral, or charged particles (atoms or molecules) are ejected from a surface of a target material through bombardment with energetic particles. A schematic sectional view of each base particle 122 is shown in FIG. 5.

In some embodiments, sputter-cleaning of the external surface 124 of the base particles 122 is carried out in a grounded chamber 142. A plasma 144 (e.g., argon ion plasma) is maintained in the grounded chamber 142 to create ions 146 (e.g., argon ions). In some embodiment, the plasma 144 may surround the base particles 122 within the grounded chamber 142. The base particles 122 (or the base powder 120) are then biased negative with respect to the plasma 144 to bombard the external surface 124 of the base particles 122 with the ions 146.

The ions 146 are used to clean-off the one or more oxides (e.g., the layer 126) on the external surface 124 of each base particle 122 to obtain the cleaned powder 130 (shown in FIG. 4). In some embodiments, sputter-cleaning of the external surface 124 of each base particle 122 is carried out in a controlled environment inside the grounded chamber 142.

Figure 6:
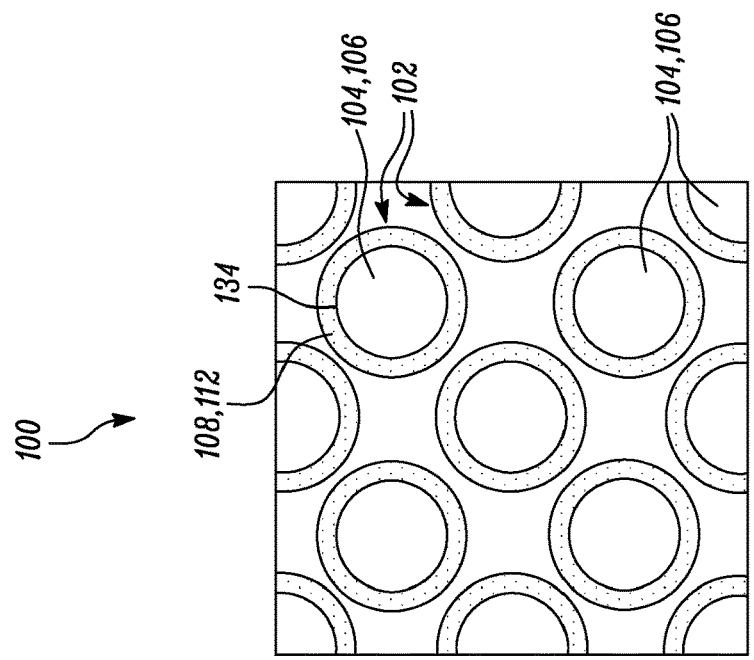
FIG. 6 is a schematic view of the cleaned powder and a coated powder, according to an embodiment of the present disclosure.
Figure 6:
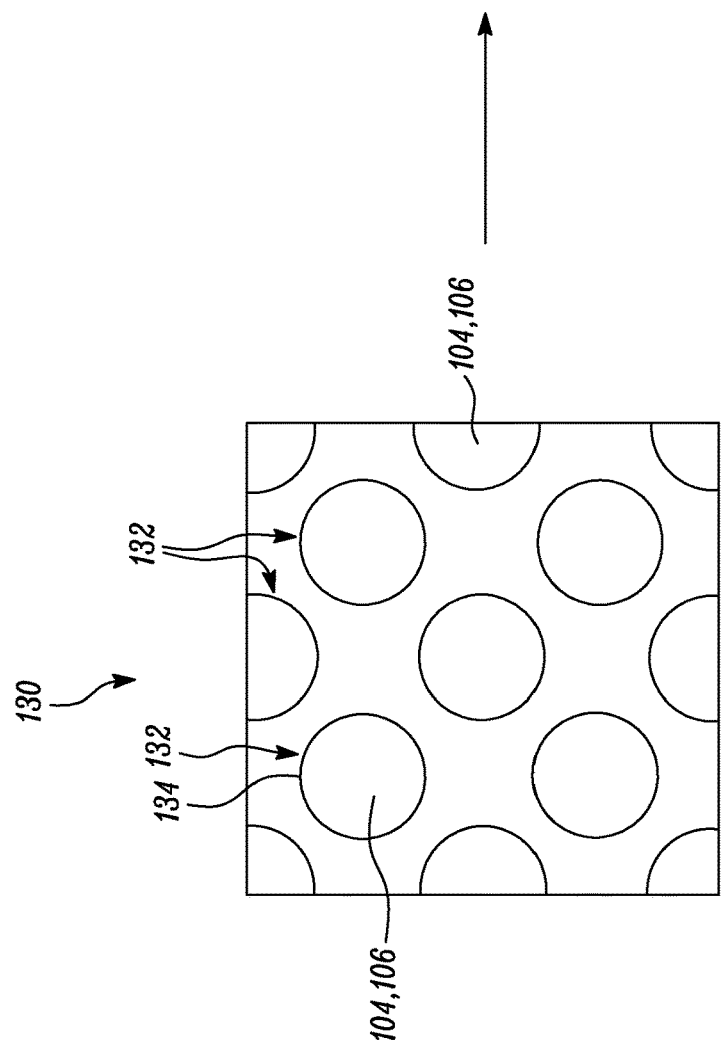

FIG. 6 illustrates a schematic view of the cleaned powder 130 and the coated powder 100, according to an embodiment of the present disclosure. Referring now to FIGS. 2 and 6, at step 156, the method 150 further includes coating the cleaned external surface 134 of each cleaned particle 132 of the cleaned powder 130 with the second material 112 having a greater oxidation resistance than the first material 106 to form the coated powder 100 including the plurality of coated particles 102. A schematic sectional view of each cleaned particle 132 and each coated particle 102 is shown in FIG. 6. Each coated particle 102 includes the external layer 108 including the second material 112 that fully covers the cleaned external surface 134 made of the first material 106. Thus, the second material 112 may prevent formation of one or more oxides on the cleaned external surface 134 of the cleaned particles 132 during subsequent processing and handling.

In some embodiments, the cleaned external surface 134 of each cleaned particle 132 is coated with the second material 112 by one of physical vapour deposition (PVD), chemical vapour deposition (CVD), and electroless plating. In some embodiments, the cleaned external surface 134 of each cleaned particle 132 is coated with the second material 112 in the same controlled atmosphere where the external surface 124 (shown in FIGS. 3-5) of each base particle 122 is cleaned to obtain the cleaned powder 130. Thus, formation of one or more oxides on the cleaned external surface 134 may be avoided during handling of the cleaned powder 130.

Figure 7:
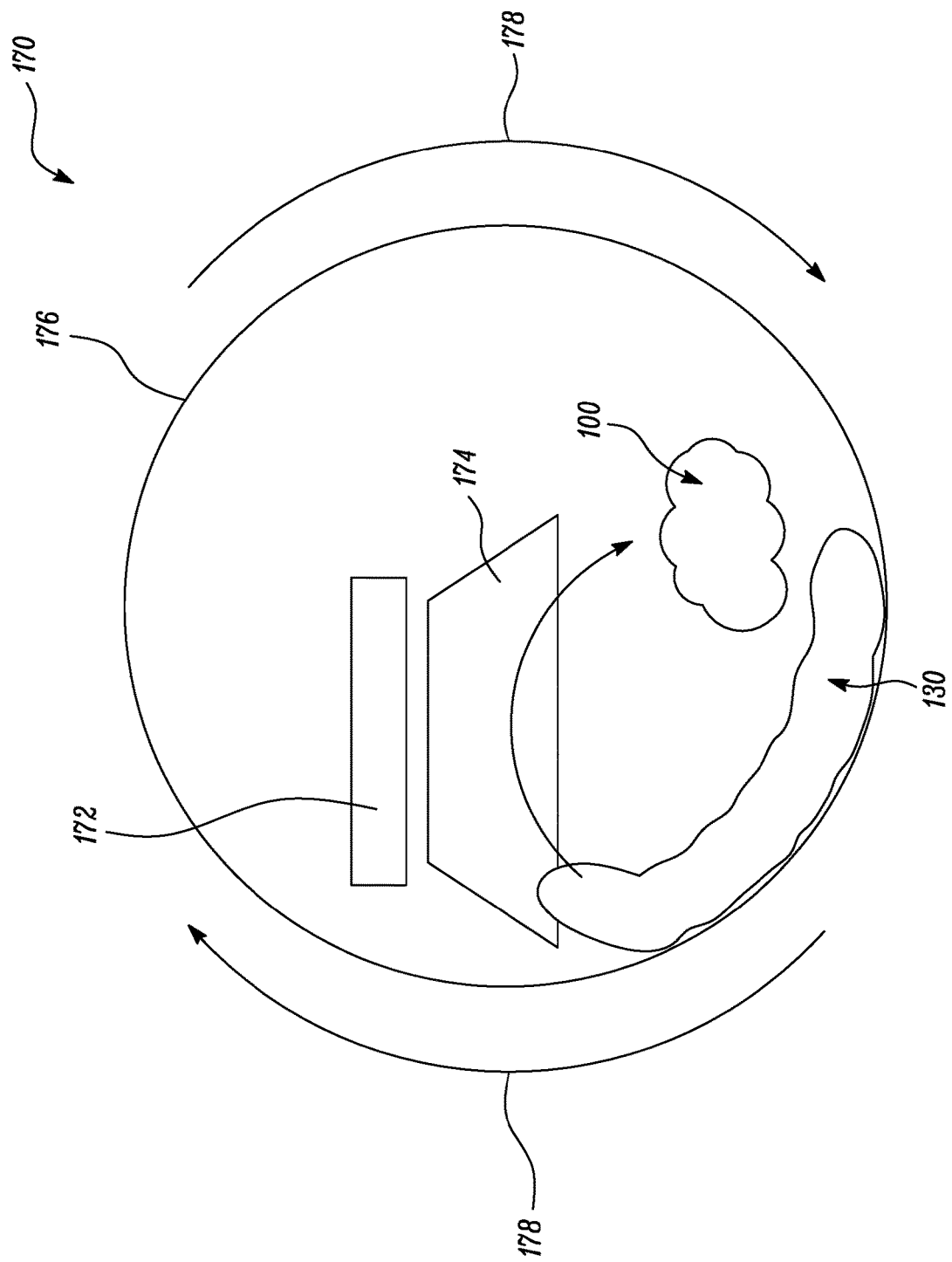
FIG. 7 is a schematic view of an apparatus for coating the cleaned powder, according to an embodiment of the present disclosure.

FIG. 7 illustrates a schematic view of an apparatus 170 for coating the cleaned external surface 134 of each cleaned particle 132 of the cleaned powder 130 (shown in FIG. 6). Specifically, the apparatus 170 allows coating the cleaned external surface 134 of each cleaned particle 132 through a PVD process. PVD processes are atomic-scale deposition processes in which a material to be deposited is vaporized in the form of atoms or molecules from a solid or liquid source, i.e., a coating feedstock 172, in a vacuum or low-pressure gaseous atmosphere inside a chamber 176. The atoms or molecules are then transported in the form of a vapor 174 to a substrate (e.g., the cleaned powder 130) where the vapor 174 condenses to form the coated powder 100 (shown in FIG. 6).

Referring now to FIGS. 6 and 7, the material to be deposited is the second material 112 having the greater oxidation resistance than the first material 106. The substrate on which the vapor 174 gets deposited is the cleaned external surface 134 of each cleaned particle 132 of the cleaned powder 130. In some embodiments, the chamber 176 may be rotated as shown by the arrows 178 to allow each cleaned particle 132 to be fully covered with the second material 112. In some embodiments, the amount of second material 112 to be coated on each cleaned particle 132 (e.g., a coating thickness) may be predetermined based on parameters, such as an average size of each cleaned particle 132. In some embodiments, the cleaned particles 132 may be coated in multiple batches of cleaned particles 132.

In some embodiments, each cleaned particle 132 is fully covered with the second material 112 on the cleaned external surface 134 to prevent formation of any undesirable oxides on the cleaned external surface 134 of each cleaned particle 132. Thus, the coated particles 102 of the coated powder 100 may not need to be maintained in a protected environment during further processing/handling due to coated particles 102 being fully covered with the second material 112 on the cleaned external surface 134. This may reduce a cost and complexity of handling the coated powder 100.

Other techniques for coating the cleaned external surface 134, such as CVD and electroless plating may also be utilized. CVD is a process in which a substrate is exposed to one or more volatile precursors (material to be deposited), which react and/or decompose on a surface of the substrate to produce a desired thin film deposit.

Electroless plating is a method of plating a metal by chemical means, in which a substrate to be plated is immersed in a reducing agent that, when catalysed by certain materials, changes metal ions to metal that forms a deposit on the substrate. It should be understood that the present disclosure is not limited to the coating techniques described above, and any know coating technique may be utilized for coating the cleaned external surface 134 of each cleaned particle 132, such as, for example, plasma vapor deposition, electronic sputtering, potential sputtering, magnetron sputtering, pulsed laser deposition, ion assisted deposition, gas flow sputtering, and/or the like.

FIG. 8 illustrates a schematic view of an apparatus 180 for forming the article 110, according to an embodiment of the present disclosure. Referring now to FIGS. 2, 6 and 8, at step 158, the method 150 further includes forming the article 110 using the coated powder 160. In some embodiments, the coated powder 160 is formed into the article 110 by a hot isostatic pressing (HIP) process, such that the second material 112 is uniformly distributed throughout a volume of the article 110 by diffusion. In the illustrated example of FIG. 8, the apparatus 180 is used to carry out the HIP process for forming the article 110.

As used herein, the term "hot isostatic pressing" generally refers to pressing at a temperature substantially over a generally accepted sintering temperature of a material of a melting powder involved, such that fusion of the melting powder is almost achieved and, where the pressing is from all sides at the same time, usually by a pressurized gaseous medium. This combination of simultaneous heat and pressure results in a compact achieving near full theoretical density, predominantly by plastic flow of the material of the melting powder.

In some embodiments, the coated powder 160 may first be enclosed or canned within capsules 182 (e.g., a capsule made of mild steel), which are produced by sheet metal forming and welding. In some embodiments, each capsule 182 deform on all surfaces during processing at high temperature and pressure. In some embodiments, each capsule 182 is designed to provide a fully dense end product of a desired shape.

The capsule 182 is placed within a pressure vessel 184 closed by top and bottom closures 186a, 186b. A compressor (not shown) may be adapted to pump a gas through an inlet 192 into the pressure vessel 184 while compressing the gas so as to obtain a very high gas pressure, e.g., in the order of 500-5,000 bars, in the pressure vessel 184. The capsule 182 is surrounded by a heat insulating member 188 which is arranged for lower heat dissipation to walls of the pressure vessel 184.

Heating elements 190 are uniformly arranged surrounding the capsule 182 for providing heat to the capsule 182. Almost 100% density and bonding may be achieved between the coated particles 164 through the HIP process and the second material 112 is uniformly distributed throughout the volume of the article 110. In some embodiments, the amount of second material 112 may be chosen based on a composition of the second material 112 in the article 110.

In some embodiments, the hot isostatic pressing process may be carried out in a non-inert and non-vacuum environment. This may be achieved due to use of the coated powder 100 having the external layer 108 (or the second material 112) coated on the coated particles 102. Thus, the second material 112 having the greater oxidation resistance than the first material 106 may allow the hot isostatic pressing process to be carried out in the non-inert and non-vacuum environment, thereby reducing a cost and complexity of the hot isostatic pressing process.

It should be understood that the base powder 120, the base particles 122, the cleaned powder 130, the cleaned particles 132, the coated powder 100, the coated particles 102, and the article 110 are shown schematically with reference to the FIGS. 1-7, and the relative size/geometry of the base particles 122, the cleaned particles 132, the coated powder 100, the external layer 108, and the layer 126 may vary based on application requirements.

It should be understood that the final desired alloy composition of the formed article may require the particle size of the powder, the thickness of the chromium and/or nickel coating, the composition of the base particles to be selected such that the final desired alloy composition is achieved. For example, where the final desired alloy composition is a low-alloy steel having a chromium and/or nickel composition below 10% by weight the composition of the low alloy steel forming the base particles will have a chromium and/or nickel composition below this value with the coating providing the additional alloying elements.

The method and composition finds particular application where the composition of the base particles has a much lower percentage of chromium and other alloying materials. For example a low alloy steel, such as SA508, has an exemplary composition of 0.18C, 1.4Mn, 0.79Ni, 0.14Cr, 0.51Mn, 0.005V, 0.22Si, 0.024Al, 0.0123N, 0.005P, 0.003S, 0.04Cu, 0.004As, 0.008C, Balance Fe (wt %). Other grades of steels such as SA508 may have different compostions where the balance of Fe forms 90%, 91%, 92%, 93%, 94%, 95%, 96%, 97%, 98% of the base particle.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A method of forming an article, the method comprising:
producing a base powder comprising a plurality of base particles, wherein each base particle is made of a low alloy steel and comprises an external surface;
removing one or more oxides from the external surface of each base particle of the base powder to form a cleaned powder comprising a plurality of cleaned particles, wherein each cleaned particle comprises a cleaned external surface;
coating the cleaned external surface of each cleaned particle of the cleaned powder with chromium having a greater oxidation resistance than the low alloy steel to form a coated powder comprising a plurality of coated particles, wherein each coated particle comprises an external layer comprising the chromium that fully covers the cleaned external surface made of the low alloy steel; and
forming the article using the coated powder.

2. The method according to claim 1, wherein the base powder is produced by one of an atomisation process, a plasma-rotating electrode process, a sol-gel process, and mechanical milling.

3. The method according to claim 2, wherein the one or more oxides from the external surface of each base particle is removed by ion beam sputtering.

4. The method according to claim 1, wherein the cleaned external surface of each cleaned particle is coated with chromium by one of physical vapour deposition, chemical vapour deposition, and electroless plating.

5. The method according to claim 1 further comprising the step of determining the average particle size of the cleaned particles and determining an average coating thickness based on the average particle size.

6. The method according to claim 1, wherein each coated particle comprises at least 90% by weight of the low alloy steel.

7. The method according to claim 6, wherein each coated particle comprises at least 92%, or 94%, or 96%, or 97% by weight of the low alloy steel.

8. The method according to claim 1, wherein each coated particle comprises at most 3%, or 4% or 6%, or 8%, or 10% by weight of the chromium.

9. The method according to claim 7, wherein each coated particle comprises at most 3%, or 4% or 6%, or 8%, or 10% by weight of the chromium.

10. The method according to claim 1, wherein the coated powder is formed into the article by a hot isostatic pressing process, such that the chromium is uniformly distributed throughout a volume of the article by diffusion.

11. The method according to claim 9, wherein the coated powder is formed into the article by a hot isostatic pressing process, such that the chromium is uniformly distributed throughout a volume of the article by diffusion.

12. The method according to claim 10, wherein the hot isostatic pressing process is carried out in a non-inert and non-vacuum environment.

13. A coated powder for forming an article, the coated powder comprising:
 a plurality of coated particles, each coated particle comprising:
  a base body made of a low alloy steel; and
  an external layer fully covering the base body,
   wherein the external layer is made of chromium having a greater oxidation resistance than the low alloy steel.

14. The coated powder according to claim 13, wherein each coated particle comprises at least 90% by weight of the low alloy steel.

15. The coated powder according to claim 13, wherein each coated particle comprises at least 92%, or 94%, 96% by weight of the low alloy steel.

16. The coated powder according to claim 13, wherein each coated particle comprises at most 3%, or 4%, or 6%, or 8%, or 10% by weight of the chromium.

17. The coated powder according to claim 15, wherein each coated particle comprises at most 3%, or 4%, or 6%, or 8%, or 10% by weight of the chromium.

18. The coated powder according to claim 13, wherein the external layer is formed by coating an external surface of each base body with chromium by one of physical vapour deposition, chemical vapour deposition, and electroless plating.

19. A method of forming a coated powder, the method comprising:
 producing a base powder comprising a plurality of base particles, wherein each base particle is made of a low alloy steel and comprises an external surface;
 removing one or more oxides from the external surface of each base particle of the base powder to form a cleaned powder comprising a plurality of cleaned particles, wherein each cleaned particle comprises a cleaned external surface;
 coating the cleaned external surface of each cleaned particle of the cleaned powder with chromium having a greater oxidation resistance than the low alloy steel to form a coated powder comprising a plurality of coated particles, wherein each coated particle comprises an external layer comprising the chromium that fully covers the cleaned external surface made of the low alloy steel.

20. A coated powder formed by the method of claim 19, wherein the cleaned external surface of each cleaned particle is coated with chromium by one of physical vapour deposition, chemical vapour deposition, and electroless plating.

* * * * *